(12) United States Patent
Wen et al.

(10) Patent No.: US 8,247,891 B2
(45) Date of Patent: Aug. 21, 2012

(54) CHIP PACKAGE STRUCTURE INCLUDING HEAT DISSIPATION DEVICE AND AN INSULATION SHEET

(75) Inventors: Chau-Chun Wen, Taoyuan County (TW); Da-Jung Chen, Taoyuan County (TW); Bau-Ru Lu, Changhua County (TW); Chun-Hsien Lu, Hsinchu (TW)

(73) Assignee: Cyntec Co., Ltd., Hsinchu (TW)

( * ) Notice: Subject to any disclaimer, the term of this patent is extended or adjusted under 35 U.S.C. 154(b) by 68 days.

(21) Appl. No.: 12/491,096

(22) Filed: Jun. 24, 2009

(65) Prior Publication Data
US 2010/0059870 A1    Mar. 11, 2010

(30) Foreign Application Priority Data

Sep. 10, 2008 (TW) .............................. 97134720 A

(51) Int. Cl.
*H01L 23/495* (2006.01)
*H01L 23/10* (2006.01)
*H01L 23/34* (2006.01)
*H01L 23/28* (2006.01)

(52) U.S. Cl. ........ 257/675; 257/706; 257/717; 257/796; 257/E23.087; 257/E23.051

(58) Field of Classification Search ............... 257/675, 257/706, 717, 796, E23.084, 718, 696, E23.087, 257/E23.051
See application file for complete search history.

(56) References Cited

U.S. PATENT DOCUMENTS

| | | | | | |
|---|---|---|---|---|---|
| 3,152,293 | A | * | 10/1964 | Ruben | 257/712 |
| 4,392,151 | A | * | 7/1983 | Iwatani | 257/692 |
| 4,924,351 | A | * | 5/1990 | Kato et al. | 361/718 |
| 4,939,570 | A | * | 7/1990 | Bickford et al. | 257/722 |
| 5,041,902 | A | * | 8/1991 | McShane | 257/706 |
| 5,402,006 | A | * | 3/1995 | O'Donley | 257/796 |
| 5,442,234 | A | * | 8/1995 | Liang | 257/675 |
| 5,444,909 | A | * | 8/1995 | Mehr | 29/827 |
| 5,583,371 | A | * | 12/1996 | Hori | 257/675 |
| 5,600,179 | A | * | 2/1997 | Suzuki | 257/690 |

(Continued)

FOREIGN PATENT DOCUMENTS

CN    2711906    7/2005

(Continued)

OTHER PUBLICATIONS

Chinese First Examination Report of China Application No. 200810213178.9, dated on Nov. 11, 2010.

*Primary Examiner* — Teresa M Arroyo
(74) *Attorney, Agent, or Firm* — Litron Patent & Trademark Office

(57) ABSTRACT

A chip package structure including a substrate, at least one chip, a plurality of leads, a heat dissipation device, a molding compound, and at least one insulating sheet is provided. The chip is disposed on the substrate. The leads are electrically connected to the substrate. The molding compound having a top surface encapsulates the chip, the substrate, and a portion of the leads. The heat dissipation device is disposed on the top surface of the molding compound. The insulating sheet disposed between the heat dissipation device and at least one of the leads has a bending line dividing the insulating sheet into a main body disposed on the molding compound and a bending portion extending from the main body.

19 Claims, 7 Drawing Sheets

U.S. PATENT DOCUMENTS

| | | | |
|---|---|---|---|
| 5,672,910 A | 9/1997 | Majumdar et al. | |
| 5,698,899 A * | 12/1997 | Hirakawa et al. | 257/712 |
| 5,789,820 A * | 8/1998 | Yamashita | 257/787 |
| 5,920,119 A * | 7/1999 | Tamba et al. | 257/718 |
| 5,986,336 A * | 11/1999 | Tomita | 257/675 |
| 6,093,960 A * | 7/2000 | Tao et al. | 257/706 |
| 6,236,567 B1 * | 5/2001 | Chen | 361/704 |
| 6,400,014 B1 * | 6/2002 | Huang et al. | 257/712 |
| 6,517,218 B2 * | 2/2003 | Hochstein | 362/294 |
| 6,787,900 B2 * | 9/2004 | Shinohara et al. | 257/718 |
| 6,833,617 B2 * | 12/2004 | Kondo et al. | 257/707 |
| 7,064,403 B2 * | 6/2006 | Weiblen et al. | 257/428 |
| 7,119,422 B2 * | 10/2006 | Chin | 257/666 |
| 7,315,077 B2 * | 1/2008 | Choi et al. | 257/666 |
| 2003/0197255 A1 * | 10/2003 | Nakajima et al. | 257/678 |
| 2004/0089928 A1 * | 5/2004 | Nakajima et al. | 257/678 |
| 2006/0076674 A1 * | 4/2006 | Takaishi | 257/712 |
| 2007/0205503 A1 * | 9/2007 | Baek et al. | 257/712 |
| 2008/0017882 A1 * | 1/2008 | Nakanishi et al. | 257/177 |
| 2009/0108423 A1 * | 4/2009 | Riedl et al. | 257/675 |
| 2009/0115037 A1 * | 5/2009 | How et al. | 257/675 |

FOREIGN PATENT DOCUMENTS

| | | |
|---|---|---|
| JP | 6-061375 | 3/1994 |
| JP | 07-106486 | 4/1995 |
| JP | 2000-236047 | 8/2000 |

* cited by examiner

US 8,247,891 B2

CHIP PACKAGE STRUCTURE INCLUDING HEAT DISSIPATION DEVICE AND AN INSULATION SHEET

CROSS-REFERENCE TO RELATED APPLICATION

This application claims the priority benefit of Taiwan application serial no. 97134720, filed on Sep. 10, 2008. The entirety of the above-mentioned patent application is hereby incorporated by reference herein and made a part of specification.

BACKGROUND OF THE INVENTION

1. Field of the Invention

The present invention generally relates to a chip package structure, in particular, to a chip package structure having high voltage protection.

2. Description of Related Art

In the design of a chip package structure in need of high voltage input (for example, a power source module in charge of the power source or an IGBT module for controlling the driving of the motor), in order to meet the safety requirements, such as the UL Standard, and ensure the normal operation of the package structure, the creepage distance and clearance distance between the voltage input end (for example, a lead) and the metal material (for example, a heat dissipation device) of the package structure should be taken into consideration, so as to prevent the conduction between the lead and the heat dissipation device to result in electrical shorts, and prevent a transient high voltage input by the lead from directly shorting to the low voltage end (i.e., the heat dissipation device) to threaten the safety of the user.

FIG. 1 is a cross-sectional view of a conventional chip package structure. Referring to FIG. 1, the conventional chip package structure 100 employs a heat fin 110 in a special shape to increase a clearance distance D1 between the heat fin 110 and leads 120. In particular, the heat fin 110 has a neck portion 112 connected to a molding compound 140, for enlarging the clearance distance D1 between the heat fin 110 and the leads 120. In addition, the molding compound 140 has several grooves 142 on a surface 144 adjacent to the heat fin 110, and the grooves 142 help to increase a creepage distance D2 between the heat fin 110 and the leads 120.

However, the heat fin 110 in a special shape can only be obtained through a particularly designed mold, so the manufacturing cost of the heat fin 110 is very high. Further, during the design of the members (such as bonding wires 150, a chip 160, a substrate 130, and a portion of the leads 120) in the molding compound 140, the positions of the above members should avoid the grooves 142, so as to prevent the members from being exposed by the grooves 142. Thus, the design freedom of the members is quite limited.

In addition, U.S. Pat. No. 5,672,910 provides a flat-shaped insulating sheet covered the heat sink to enlarge the creepage distance and the clearance distance. However, the excessively long flat-shaped insulating sheet may affect the convection of the heat sink and increase the size of the package structure. Moreover, package structures disclosed in U.S. Pat. No. 5,698,899 and Japanese Patent Publication No. 06-061375 and No. 2000-236047 all cannot effectively enlarge the creepage distance and the clearance distance.

SUMMARY OF THE INVENTION

In accordance with the present invention, a chip package structure can increase the creepage distance and clearance distance between leads and a heat dissipation device, so as to meet safety requirements while the chip package structure has a need of high voltage input.

In one embodiment of the present invention, a chip package structure includes a substrate, at least one chip, a plurality of leads, a heat dissipation device having a top surface, a molding compound, and at least one insulating sheet. The chip is disposed on the substrate. The leads are electrically connected to the substrate. The molding compound encapsulates the chip, the substrate, and a portion of the leads. The heat dissipation device is disposed on the top surface of the molding compound. The insulating sheet is disposed between the heat dissipation device and at least one of the leads. The insulating sheet has a bending line dividing the insulating sheet into a main body disposed on the molding compound and a first bending portion extending from the main body.

As described above, the chip package structure of the present invention may increase the creepage distance and clearance distance between the heat dissipation device and the leads through the insulating sheet.

In order to make the aforementioned and other objectives, features, and advantages of the present invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
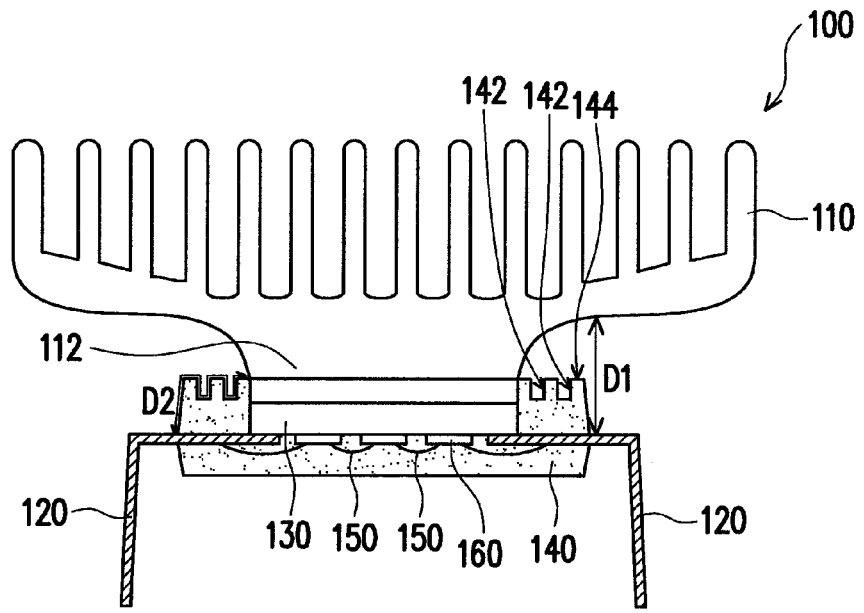
FIG. 1 is a cross-sectional view of a conventional chip package structure.

Reference will now be made in detail to the present embodiments of the invention, examples of which are illustrated in the accompanying drawings. Wherever possible, the same reference numbers are used in the drawings and the description to refer to the same or like parts.

Figure 2:
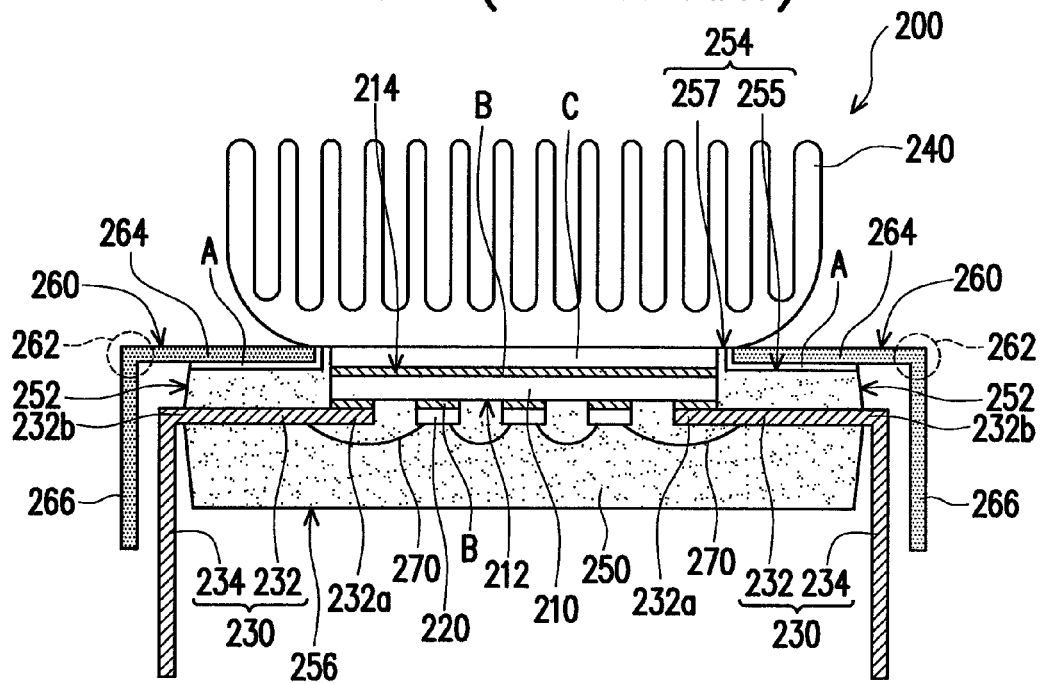
FIG. 2 is a cross-sectional view of a chip package structure according to an embodiment of the present invention.

FIG. 2 is a cross-sectional view of a chip package structure according to an embodiment of the present invention.

Referring to FIG. 2, a chip package structure 200 of this embodiment includes a substrate 210, at least one chip 220, a plurality of leads 230, a heat dissipation device 240, a molding compound 250, and at least one insulating sheet 260.

The substrate 210 has a first surface 212 and a second surface 214 opposite to the first surface 212. The substrate 210 is a printed circuit board (PCB), direct copper bonded (DCB) ceramic substrate, direct aluminum bonded (DAB) ceramic substrate, insulated metal substrate (IMS), or lead frame.

The chip 220 is disposed on the substrate 210. In this embodiment, a plurality of the chips 220 is disposed on the first surface 212 of the substrate 210, and is electrically connected to the substrate 210 by means of wire bonding or flip-chip bonding. The chips 220 are, for example, interconnected through several bonding wires 270. The chips 220 may be logic control devices or power devices such as insulated gate bipolar transistors (IGBTs) or metal-oxide-semiconductor field-effect transistors (MOSFETs).

The leads 230 are electrically connected to the substrate 210, for inputting a high voltage to the substrate 210 and the chips 220. In this embodiment, a plurality of leads 230 is disposed on the first surface 212 of the substrate 210, and is, for example, electrically connected to the chips 220 through several bonding wires 270. Further, the leads 230 and the chips 220 are fixed to the substrate 210 by a bonding material B, for example, a solder or adhesive. However, when the lead frame serves as the substrate 210, the leads 230 are directly integrally formed with the substrate 210 into a portion of the lead frame, and thus the step of bonding the leads 230 to the substrate 210 can be saved. It should be noted that, as for the distribution configuration of the leads, the chip package structure 200 of this embodiment takes a dual inline package (DIP) as an example for illustration, but the present invention is not limited thereto. For example, in other embodiments, the chip package structure 200 may also be a single inline package (SIP), small outline package (SOP), thin small outline package (TSOP), quad flat package (QFP), or other suitable package structures.

The molding compound 250 encapsulates the chips 220, the substrate 210, the bonding wires 270, and a portion of the leads 230. In this embodiment, the molding compound 250 encapsulates a portion of the leads 230 adjacent to the substrate 210, and the rest of the leads 230 are located exposed out of the molding compound 250. The molding compound 250 has a top surface 254, a bottom surface 256 opposite to the top surface 254, and two side walls 252 connecting the top surface 254 and the bottom surface 256. The molding compound 250 optionally has a plurality of grooves (not shown) or no groove disposed on the top surface 254. It should be noted that, when no groove is formed on the top surface 254 of the molding compound 250, the members (such as the bonding wires 270, the chips 220, the substrate 210, and a portion of the leads 230) in the molding compound 250 have more design freedom.

The heat dissipation device 240, for example, a heat sink with fin, is disposed on the top surface 254 of the molding compound 250. It should be noted that, different from the conventional package structure in FIG. 1, the heat dissipation device 240 of this embodiment may be a common heat sink, i.e., a heat sink without a neck portion, such that the manufacturing cost of the heat dissipation device 240 is low. A material of the heat dissipation device 240 is, for example, metal (for example, aluminum or copper), ceramics, plastics, or other suitable thermal conductive materials. Further, a heat-conducting plate C is disposed between the heat dissipation device 240 and the substrate 210, and thus the heat generated by the chips 220 is conducted to the heat dissipation device 240 through the substrate 210 and the heat-conducting plate C. The heat-conducting plate C is connected to the substrate 210 through the bonding material B. A material of the heat-conducting plate C includes copper or other materials with good thermal conductivity.

Each lead 230 has a main portion 232 and an externally bending portion 234 connected to the main portion 232. One end 232a of the main portion 232 is disposed on the first surface 212 and located in the molding compound 250. The other end 232b of the main portion 232 extends along the first surface 212 towards the side walls 252, and further extends from the side walls 252 so as to be connected to the corresponding externally bending portion 234. The externally bending portion 234 extends in a direction away from the heat dissipation device 240, in other words, the externally bending portion 234 in FIG. 2 extends downwards.

The insulating sheet 260 is disposed between the heat dissipation device 240 and at least one of the leads 230 exposed out of the molding compound 250, and has a bending line 262 dividing the insulating sheet 260 into a main body 264 and a first bending portion 266 extending from the main body 264. A material of the insulating sheet 260 includes plastics, ceramics, glass, silica gel, or other suitable insulating materials. In this embodiment, the main body 264 is disposed on the top surface 254 of the molding compound 250 adjacent to the heat dissipation device 240. In this embodiment, the first bending portion 266 extends in a direction away from the heat dissipation device 240. In other words, the first bending portion 266 in FIG. 2 substantially extends downwards in the same direction as the externally bending portion 234. Further, in this embodiment, the first bending portion 266 is substantially located on the periphery of the externally bending portion 234, and the leads exposed out of the molding compound 250 (i.e., the externally bending portions 234) are disposed between the molding compound 250 and the first bending portion 266. An adhesive layer A is disposed between the insulating sheet 260 and the molding compound 250, so as to fix the insulating sheet 260 on the molding compound 250. A material of the adhesive layer A includes resin or other suitable insulating adhesives. Moreover, the molding compound 250 has a recessed portion 255 and a protruding portion 257 on the top surface 254. In particular, after the recessed portion 255 is formed on the periphery of the top surface 254, the rest part of the top surface 254 constitutes the protruding portion 257. The protruding portion 257 is higher than the recessed portion 255 by a distance greater than or equal to the thickness of the insulating sheet 260. The heat dissipation device 240 is connected to the protruding portion 257, and the recessed portion 255 is used for receiving the main body 264 of the insulating sheet 260. Through the recessed portion 255, the heat dissipation device 240 may be disposed without being interfered by the insulating sheet 260, and the height of the protruding portion 257 further increases the creepage distance between the heat dissipation device 240 and the leads 230.

In this embodiment, since the chip package structure 200 includes an insulating sheet 260 with the bending portion 266, the insulating sheet 260 can be used to increase the creepage distance and clearance distance between the heat dissipation device 240 and the leads 230. As such, the chip package structure 200 can meet the safety requirements while the chip package structure 200 has a need of high voltage input. Further, as the insulating sheet 260 is a bending structure, a larger creepage distance and clearance distance can be achieved by increasing the length of the insulating sheet and bending the insulating sheet. Thus, the present invention is superior to the conventional U.S. Pat. No. 5,672,910 in which the same purpose can only be fulfilled by increasing the length of the insulating sheet. Therefore, the insulating sheet 260 of the present invention may solve the problems in the prior art that the size of the chip package structure may be increased and the convection of the heat dissipation device may be affected.

Figure 3:
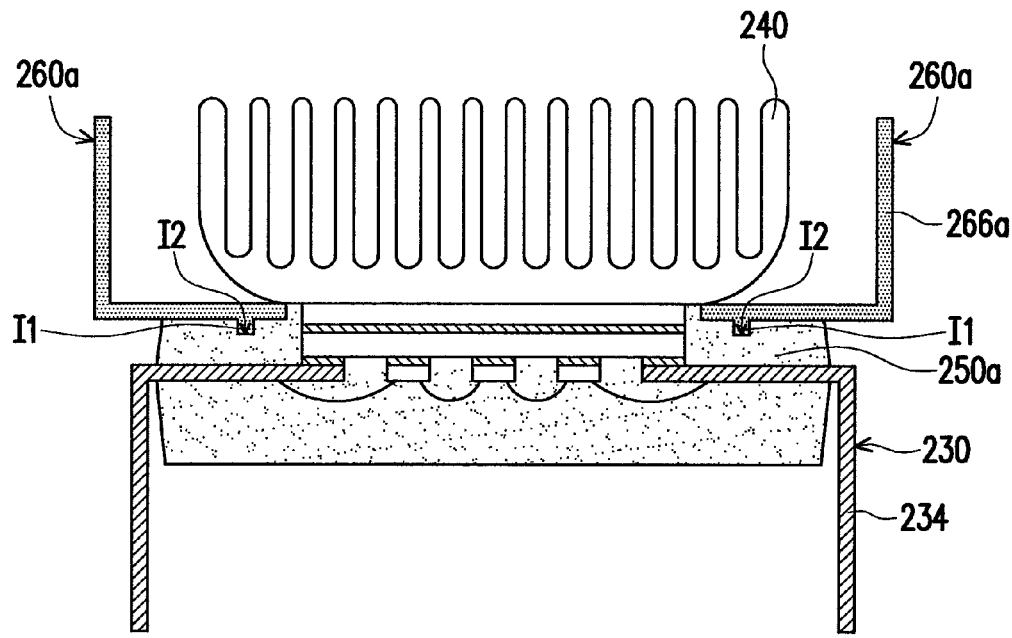
FIGS. 3 to 8 are cross-sectional views of various structures of the insulating sheet in FIG. 2.

FIG. 3 to FIG. 8 are cross-sectional views of various structures of the insulating sheet in FIG. 2. Referring to FIG. 3, the first bending portion 266a extends towards the heat dissipation device 240. In other words, the first bending portion 266a substantially extends upwards in a direction opposite to the externally bending portion 234. Further, in this embodiment, the first bending portion 266a is substantially located on the periphery of the heat dissipation device 240. In this embodiment, the insulating sheet 260a has a first infixing portion I1, the molding compound 250a has a second infixing portion I2, and the first infixing portion I1 is engaged with the second infixing portion I2 so as to fix the insulating sheet 260a on the molding compound 250a. In this embodiment, the first infixing portion I1 is a protrusion, and the second infixing portion I2 is a recess. In other embodiments, the first infixing portion is a recess, and the second infixing portion is a protrusion.

Figure 4:
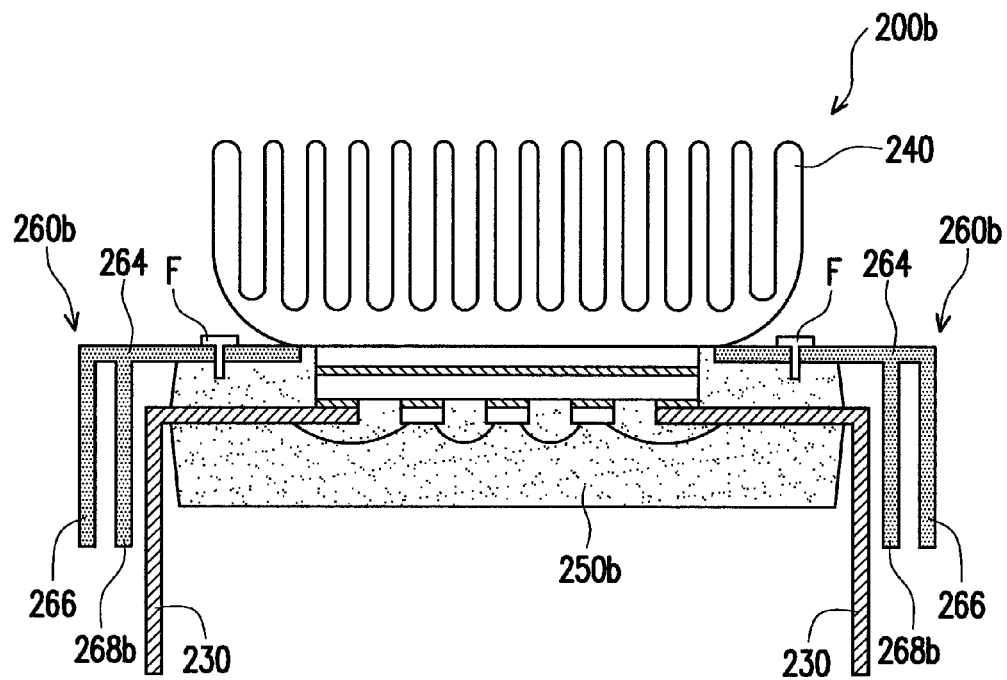

Referring to FIG. 4, in this embodiment, the insulating sheet 260b further has a second bending portion 268b extending from the main body 264. The second bending portion 268b extends in the same direction as the first bending portion 266, so as to increase the creepage distance between the heat dissipation device 240 and the leads 230. Further, in this embodiment, the chip package structure 200b also has a plurality of fixing members F penetrating the insulating sheet 260b and inserted in the molding compound 250b. The fixing members F may be screws or pins.

Figure 5:
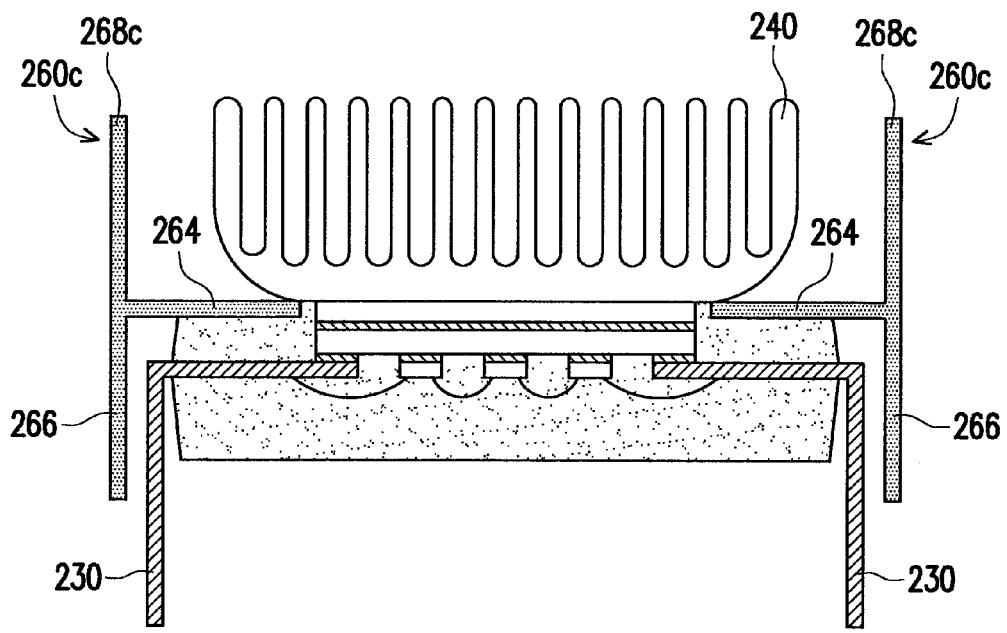

Referring to FIG. 5, in this embodiment, the second bending portion 268c of the insulating sheet 260c extends in a direction opposite to the first bending portion 266, so as to increase the creepage distance and clearance distance between the heat dissipation device 240 and the leads 230.

Figure 6:
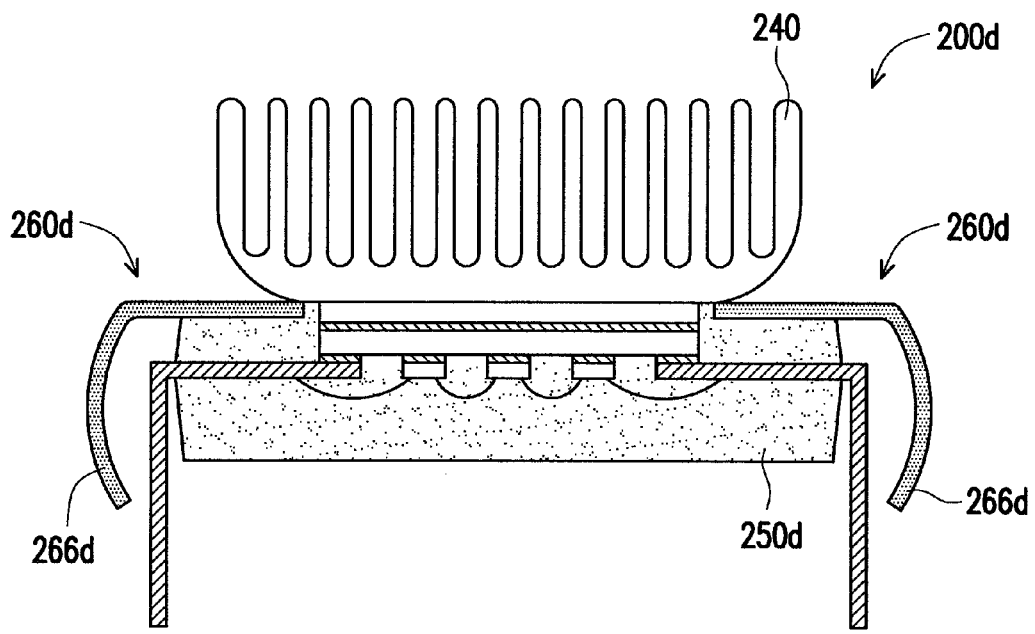
Figure 7:
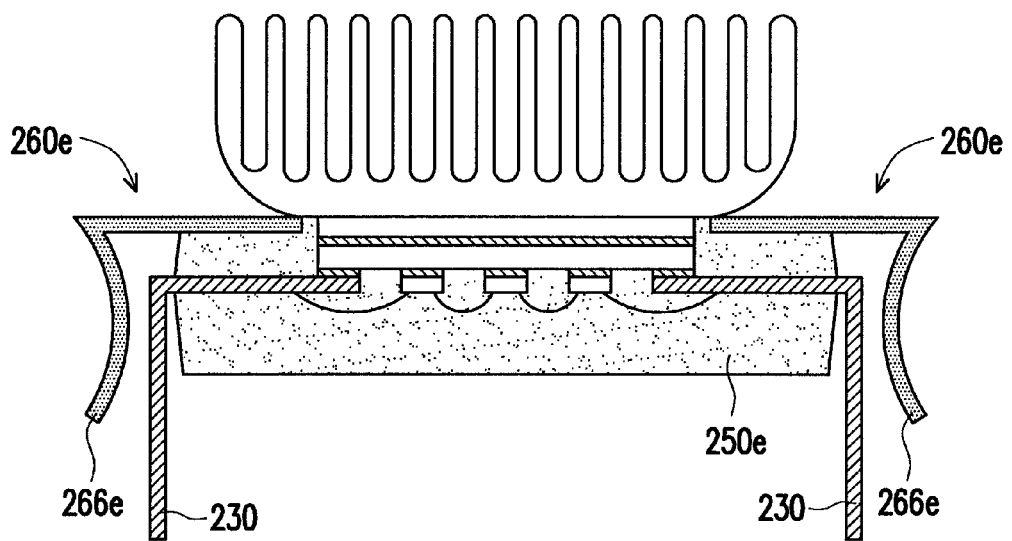

Referring to FIG. 6, in this embodiment, the first bending portion 266d of the insulating sheet 260d is an arc-shaped structure, and the recess of the arc-shaped structure faces the molding compound 250d. Further, in other embodiments, the recess of the first bending portion 266e in the insulating sheet 260e is opposite to the molding compound 250e (referring to FIG. 7). The creepage distance between the heat dissipation device 240 and the leads 230 can be increased by the arc-shaped structure.

Figure 8:
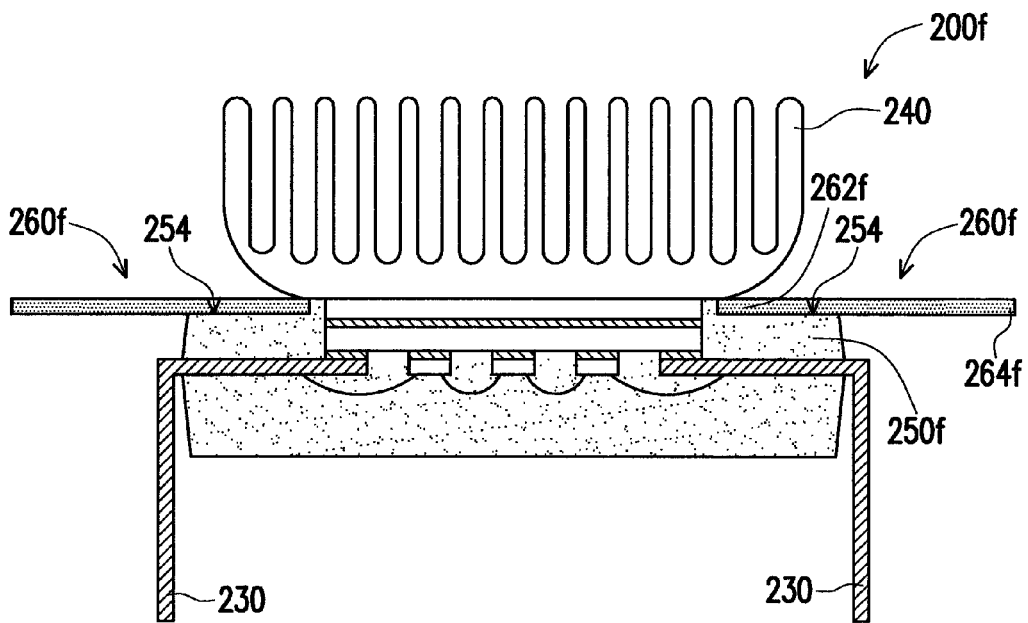

Referring to FIG. 8, in this embodiment, the insulating sheet 260f is of a plate-like structure. One end 262f of the insulating sheet 260f is disposed on the top surface 254 of the molding compound 250f adjacent to the heat dissipation device 240, and the other end 264f of the insulating sheet 260f extends out of the package structure 200f.

Figure 9:
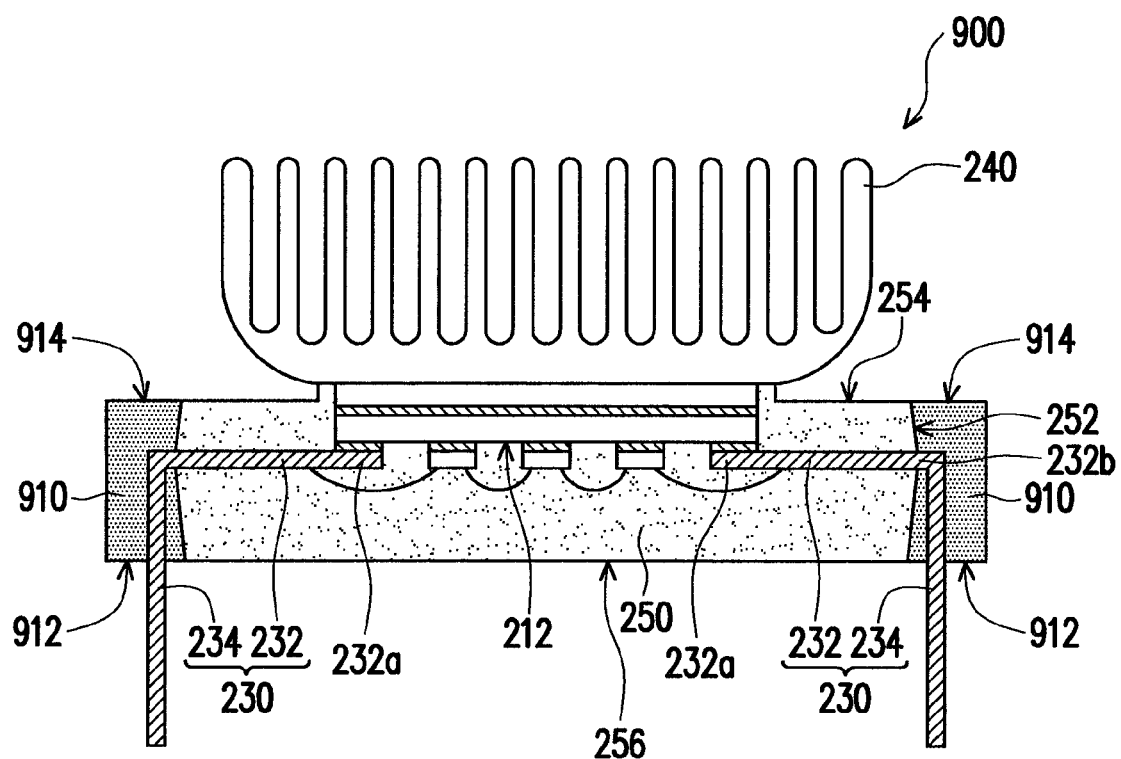
FIG. 9 is a cross-sectional view of a chip package structure according to another embodiment of the present invention.

FIG. 9 is a cross-sectional view of a chip package structure according to another embodiment of the present invention. Referring to FIG. 9, a chip package structure 900 of this embodiment is similar to the chip package structure 200 in FIG. 2, and the difference is that the chip package structure 900 has a plurality of insulating bumps 910 instead of the insulating sheet 260. In this embodiment, the insulating bumps 910 are disposed on the side walls 252 of the molding compound 250, and each insulating bump 910 has a bottom surface 912 facing a direction away from the heat dissipation device 240 and a top surface 914 opposite to the bottom surface 912. One end 232a of the main portion 232 of each lead 230 is disposed in the molding compound 250, and the other end 232b extends along the first surface 212 towards the side wall 252 so as to be connected to the corresponding externally bending portion 234 in the insulating bump 910. The externally bending portion 234 extends from the interior of the insulating bump 910 towards the bottom surface 912, and then extends out of the bottom surface 912. In other words, the insulating bump 910 encapsulates the portion of the main portion 232 exposed out of the molding compound 250 and a portion of the externally bending portion 234 connected to the corresponding main portion 232. In this embodiment, the bottom surface 912 of each insulating bump 910 is substantially aligned with the bottom surface 256 of the molding compound 250, and the top surface 914 of each insulating bump 910 is substantially aligned with the top surface 254 of the molding compound 250.

It should be noted that, in this embodiment, the insulating bumps 910 cover the leads 230 extending from the side walls 252 of the molding compound 250, such that the leads 230 extend from the bottom surfaces 912 of the insulating bumps 910. Thus, the insulating bumps 910 may increase the creepage distance and clearance distance between the heat dissipation device 240 and the leads 230.

In this embodiment, the molding compound 250 and the insulating bumps 910 are two parts to construct a double-mold structure. In other words, the molding compound 250 is formed by a mold resin process and the insulating bumps 910 is formed by the other mold resin process. As such, without changing the existing packaging process, an additional packaging process is performed on the chip package structure 900 to form the insulating bumps 910. A material of the insulating bumps 910 includes plastics, ceramics, glass, or other suitable packaging materials, and a material of the molding compound 250 is identical to that of the insulating bumps 910.

Figure 10A:
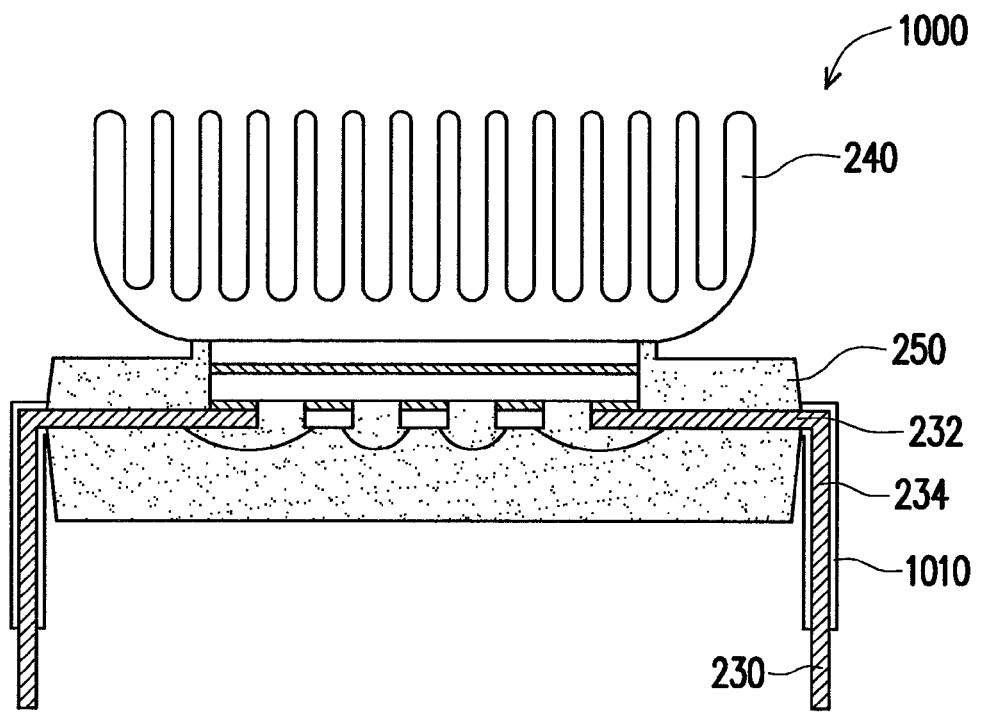
FIG. 10A is a cross-sectional view of a chip package structure according to still another embodiment of the present invention.
Figures 10B, 10C:
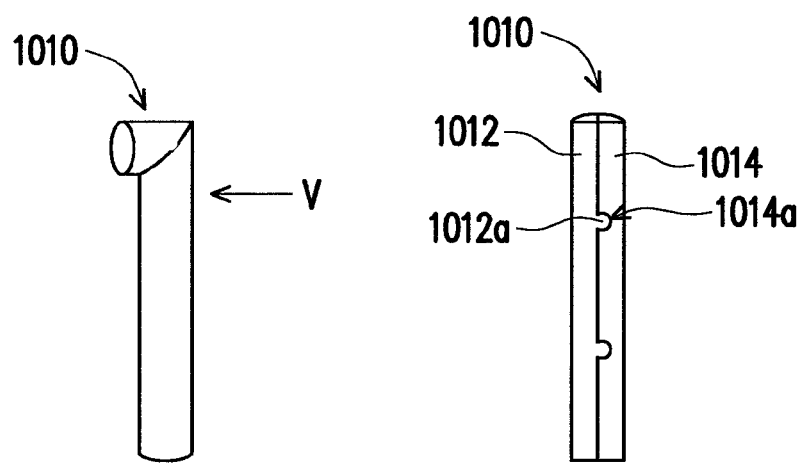
FIG. 10B is a three-dimensional view of an insulating sleeve in FIG. 10A.
FIG. 10C is a view from the direction pointed by an arrow V in FIG. 10B.

FIG. 10A is a cross-sectional view of a chip package structure according to still another embodiment of the present invention. FIG. 10B is a three-dimensional view of an insulating sleeve in FIG. 10A. FIG. 10C is a view from the direction pointed by an arrow V in FIG. 10B. Referring to FIG. 10A, a chip package structure 1000 of this embodiment is similar to the chip package structure 200 in FIG. 2, and the difference is that the chip package structure 1000 has a plurality of insulating sleeves 1010 instead of the insulating sheet 260. Each lead 230 is provided with one of the insulating sleeves 1010. A material of the insulating sleeve 1010 includes plastics, silica gel, ceramics, or other suitable insulating materials. The insulating sleeve 1010 encapsulates a portion of the leads 230. In particular, the insulating sleeve 1010 encapsulates the portion of the main portion 232 exposed out of the molding compound 250 and a portion of the externally bending portion 234 connected to the corresponding main portion 232, so as to increase the creepage distance and clearance distance between the heat dissipation device 240 and the leads 230. The insulating sleeve 1010 is fixed to the lead 230 in the manner of directly passing through the insulating sleeve 1010 by the lead 230 and then filling adhesives (not shown) between the insulating sleeve 1010 and the lead 230.

Further, the insulating sleeve 1010 can be fixed to the lead 230 by catching the insulating sleeves 1010 on the lead 230 and then filling adhesives (not shown) between the insulating sleeve 1010 and the lead 230. In particular, referring to FIGS. 10B and 10C together, the insulating sleeve 1010 has a first portion 1012 and a second portion 1014. The first portion 1012 has a plurality of first infixing portions 1012a, and the second portion 1014 has a plurality of second infixing portions 1014a. The first portion 1012 and the second portion 1014 are interconnected through the engagement between each first infixing portion 1012a and the corresponding second infixing portion 1014a. The first infixing portion 1012a is a protrusion or recess, and the second infixing portion 1014a is a recess or protrusion accordingly.

Figure 11:
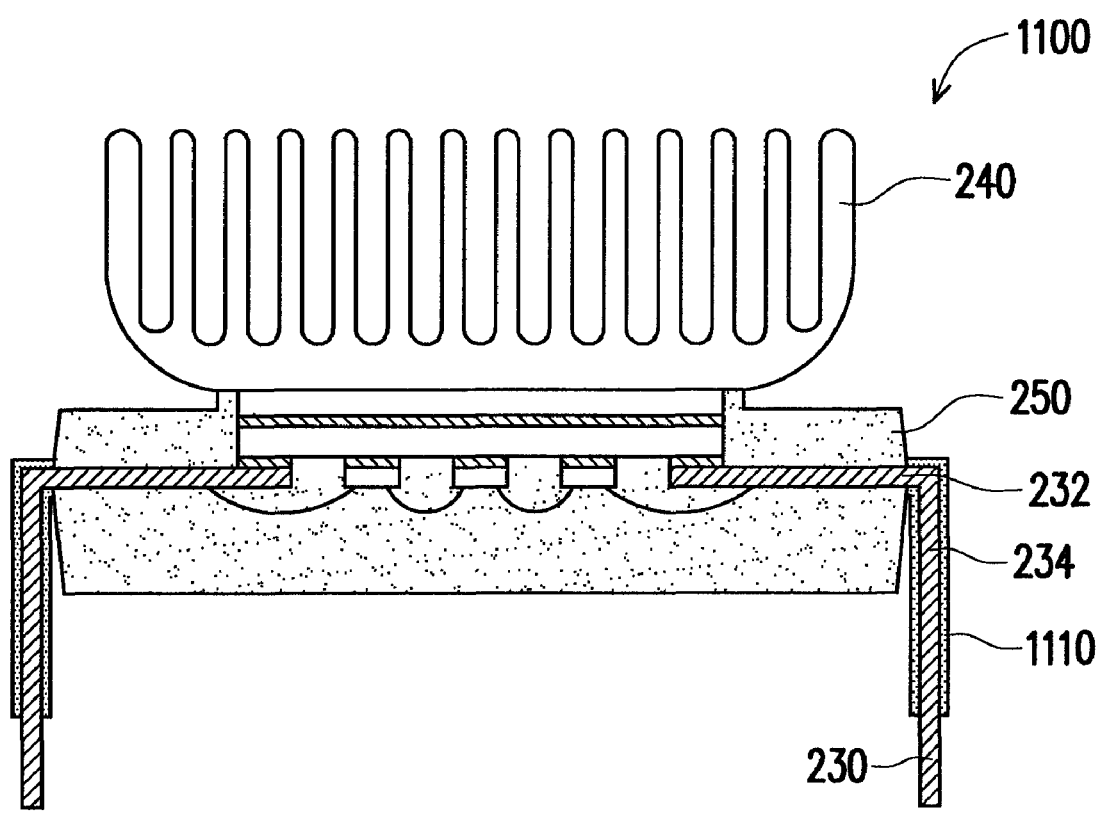
FIG. 11 is a cross-sectional view of a chip package structure according to still another embodiment of the present invention.

FIG. 11 is a cross-sectional view of a chip package structure according to still another embodiment of the present invention. Referring to FIG. 11, a chip package structure 1100 of this embodiment is similar to the chip package structure 200 in FIG. 2, and the difference is that the chip package structure 1100 has a plurality of insulating layers 1110 instead of the insulating sheet 260, and each lead 230 is provided with one of the insulating layers 1100.

The insulating layer 1110 encapsulates a portion of the leads 230. In particular, the insulating layer 1110 encapsulates the portion of the main portion 232 exposed out of the molding compound 250 and a portion of the externally bending portion 234 connected to the corresponding main portion 232, so as to increase the creepage distance and clearance distance between the heat dissipation device 240 and the leads 230. A material of the insulating layer 1110 includes thermosetting plastics, silica gel, ceramic adhesive, or other suitable insulating adhesives. The insulating layer 1110 is formed by, for example, dipping, coating, spraying, or molding.

It should be noted that, in other embodiments, the chip package structure may include at least two of the insulating sheet 260 in FIG. 2 to FIG. 8, the insulating bumps 910 in FIG. 9, the insulating sleeves 1010 in FIG. 10A, and the insulating layers 1110 in FIG. 11, so as to increase the creepage distance and clearance distance larger than the chip package structure 100, 200, 900, 1000, 1100. For example, the insulating sheet 260 and the insulating bumps 910 can be used in the chip package structure 200, the insulating sheet 260 and the insulating sleeves 1010 can be used in the chip package structure 200, or the insulating sheet 260 and the insulating layers 1110 can be used in the chip package structure 200.

In view of the above, the chip package structure of the present invention at least has the following advantages.

1. In the chip package structure of the present invention, the insulating sheet can be used to increase the creepage distance and clearance distance between the heat dissipation device and the leads. Therefore, the chip package structure can meet the safety requirements while the chip package structure has a need of high voltage input. Moreover, the insulating sheet is a bending structure, and thus the insulating sheet may not increase the size of the chip package structure nor affect the convection of the heat dissipation device. In addition, the heat dissipation device of the present invention does not need a special shape as the conventional one, so the manufacturing cost thereof is lower.

2. In the chip package structure of the present invention, the insulating bump covers the leads extending from the sidewall of the molding compound, such that the leads may extend from the bottom surface of the insulating bump to increase the creepage distance and clearance distance between the heat dissipation device and the leads. The molding compound and the insulating bump are two parts to construct a double-mold structure. Thus, without changing the existing packaging process, an additional packaging process is performed on the chip package structure to form the insulating bump.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package structure, comprising:
   a substrate having a first sidewall, a second sidewall opposite to the first sidewall, and a first surface connecting the first sidewall and the second sidewall;
   a chip, disposed on the first surface of the substrate;
   a plurality of leads, electrically connected to the substrate;
   a molding compound, encapsulating the chip, the substrate, and a first portion of each of the plurality of leads, wherein the molding compound comprises a first protruding portion adjacent to the first sidewall, a first recessed portion adjacent to the first protruding portion, a second protruding portion adjacent to the second sidewall and a second recessed portion adjacent to the second protruding portion; and
   a heat dissipation device, disposed on the first protruding portion and the second protruding portion of the molding compound, wherein the molding compound comprises a top surface, a bottom surface and a first sidewall connecting the top surface and the bottom surface of the molding compound, wherein a second portion of a first lead of the plurality of leads extends out of the first sidewall of the molding compound, further comprising an insulating unit disposed outside of the molding compound to insulate the heat dissipation device from the second portion of the first lead, wherein the second portion of the first lead comprises a bending portion extending in a direction away from the heat dissipation device.

2. The chip package structure according to claim 1, wherein the insulating unit is an insulating sheet to insulate the second portion of the first lead from the heat dissipation device, wherein the insulating sheet comprises a main body, wherein a portion of the main body is disposed on the first recessed portion of the molding compound, wherein the first recessed portion and the first sidewall of the molding compound are adjacent to each other.

3. The chip package structure according to claim 2, wherein the insulating sheet further comprises a first bending portion extending from the main body outside of the molding compound, wherein the first bending portion of the insulating sheet extends in a direction away from the heat dissipation device.

4. The chip package structure according to claim 2, wherein the insulating sheet further comprises a first bending portion extending from the main body outside of the molding compound, wherein the first bending portion of the insulating sheet extends in a direction towards the heat dissipation device.

5. The chip package structure according to claim 3, wherein the insulating sheet further comprises a second bending portion extending from the main body outside of the molding compound, wherein the second bending portion of the insulating sheet extends in a direction opposite to the first bending portion of the insulating sheet.

6. The chip package structure according to claim 3, wherein the insulating sheet further comprises a second bending portion extending from the main body outside of the molding compound, wherein the second bending portion of the insulating sheet extends in the same direction as the first bending portion of the insulating sheet.

7. The chip package structure according to claim 3, wherein the first bending portion of the insulating sheet is an arc-shaped structure.

8. The chip package structure according to claim 3, wherein the second portion of the first lead is located between the molding compound and the first bending portion of the insulating sheet.

9. The chip package structure according to claim 2, wherein a material of the insulating sheet comprises at least one of plastics, ceramics, glass, and silica gel.

10. The chip package structure according to claim 2, further comprising an adhesive layer disposed between the insulating sheet and the molding compound.

11. The chip package structure according to claim 2, further comprising a fixing member penetrating the insulating sheet and inserted in the molding compound, wherein the fixing member is a screw or a pin.

12. The chip package structure according to claim 2, wherein the insulating sheet further comprises a first infixing portion located at the first recessed portion of the molding compound; and the molding compound comprises a second infixing portion corresponding to the first infixing portion, wherein the first infixing portion is engaged with the second infixing portion.

13. The chip package structure according to claim 1, wherein the insulating unit is an insulating bump disposed on the first sidewall of the molding compound, wherein the insulating bump has a bottom surface facing a direction far from the heat dissipation device, wherein one portion of the bending portion of the second portion of the first lead is encapsulated by the insulating bump and the other portion of the bending portion of the second portion of the first lead extends out of the bottom surface of the insulating bump.

14. The chip package structure according to claim 13, wherein the bottom surfaces of the insulating bump is substantially aligned with the bottom surface of the molding compound.

15. The chip package structure according to claim 1, wherein the substrate is a printed circuit board (PCB), direct copper bonded (DCB) ceramic substrate, direct aluminum bonded (DAB) ceramic substrate, or insulated metal substrate (IMS).

16. The chip package structure according to claim 1, wherein the substrate and the plurality of leads form a lead frame.

17. The chip package structure according to claim 1, wherein the insulating unit is an insulating sleeve to insulate the heat dissipation device from the second portion of the first lead, wherein one portion of the bending portion of said second portion is encapsulated by the insulating sleeve and the other portion of the bending portion of said second portion extends out of the insulating sleeve.

18. The chip package structure according to claim 1, wherein the insulating unit is an insulating layer to insulate the heat dissipation device from the second portion of the first lead, wherein one portion of the bending portion of said second portion is encapsulated by the insulating layer and the other portion of the bending portion of said second portion extends out of the insulating layer.

19. A chip package structure, comprising:
a substrate;
at least one chip, disposed on the substrate;
a plurality of leads, electrically connected to the substrate;
a molding compound, having a top surface and encapsulating the chip, the substrate, and a portion of the leads;
a heat dissipation device, disposed on the top surface of the molding compound;
a plurality of insulating units, disposed by the molding compound, and at least one of the leads located between the molding compound and one of the insulating units; and
a plurality of fixing members penetrating the insulating units and inserted in the molding compound, wherein the fixing members are screws or pins.

* * * * *